United States Patent
Nakai

(10) Patent No.: US 7,813,178 B2
(45) Date of Patent: Oct. 12, 2010

(54) SEMICONDUCTOR MEMORY DEVICE AND WRITE CONTROL METHOD THEREFOR

(75) Inventor: Kiyoshi Nakai, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 374 days.

(21) Appl. No.: 12/003,163

(22) Filed: Dec. 20, 2007

(65) Prior Publication Data

US 2008/0151656 A1    Jun. 26, 2008

(30) Foreign Application Priority Data

Dec. 25, 2006   (JP)   ............... 2006-347776

(51) Int. Cl.
*G11C 11/34* (2006.01)
(52) U.S. Cl. .............. 365/185.12; 365/210; 365/189.07
(58) Field of Classification Search ............ 365/185.12, 365/210, 189.07, 189.12, 200, 225.7, 185.33, 365/185.11, 185.09
See application file for complete search history.

(56) References Cited

U.S. PATENT DOCUMENTS

| | | | |
|---|---|---|---|
| 6,985,395 B2 * | 1/2006 | Yoshimatsu et al. .... | 365/189.07 |
| 7,242,605 B2 | 7/2007 | Choi et al. | |
| 7,286,394 B2 * | 10/2007 | Ooishi ...................... | 365/158 |
| 7,313,030 B2 * | 12/2007 | Lohse et al. ........... | 365/185.33 |
| 2001/0021120 A1 * | 9/2001 | Oowaki ...................... | 365/145 |

FOREIGN PATENT DOCUMENTS

| | | |
|---|---|---|
| JP | 60-52999 | 3/1985 |
| JP | 5-282882 | 10/1993 |
| JP | 6-76586 | 3/1994 |
| JP | 2005-100617 | 4/2005 |
| JP | 2006-302465 | 11/2006 |

OTHER PUBLICATIONS

Japanese Office Action dated Nov. 18, 2008 with a partial English translation.

* cited by examiner

*Primary Examiner*—Dang T Nguyen
(74) *Attorney, Agent, or Firm*—McGinn IP Law Group PLLC

(57) ABSTRACT

Disclosed is a semiconductor memory device which includes a read data latch that holds read data from a phase change memory and latches write data entered from outside and holds write data entered from outside, a write data latch that holds the write data for a cell for the time duration of a preset number of cycles until start of data write, a transfer switch that controls whether or not an output of the read data latch is to be transferred to the write data latch, a comparator circuit that decides whether or not data transferred to the write data latch via the transfer switch and held in the write data latch and data in the read data latch are coincident with each other, and a write flag latch that latches an output of the comparator circuit. Data is written only in case there is a write request and the result of comparison of the comparator circuit indicates non-coincidence, that is, only in bits in need of data writing.

20 Claims, 11 Drawing Sheets

SEMICONDUCTOR MEMORY DEVICE AND WRITE CONTROL METHOD THEREFOR

REFERENCE TO RELATED APPLICATION

This application is based upon and claims the benefit of the priority of Japanese patent application No. 2006-347776, filed on Dec. 25, 2006, the disclosure of which is incorporated herein in its entirety by reference thereto.

FIELD OF THE INVENTION

This invention relates to a semiconductor memory device and, more particularly, to a method and an apparatus that may be used with advantage for writing in a phase change memory.

BACKGROUND OF THE INVENTION

A phase change memory (PRAM) is a device in which data is stored by controlling crystalline state of a phase change material such as Ge2Sb2Te5 with Joule's heat generated by current flowing through the phase change material.

If the device is heated to higher than its melting point, and cooled at a faster rate, the device is turned into a high-resistance amorphous state (RESET state).

If the phase change memory is heated to a temperature not lower than its melting point, kept at this temperature for a longer time and cooled at a slower rate, the device is in a low-resistance crystallized state (SET state). Data is stored in the phase change memory by controlling the two types of crystalline states, that is, the high-resistance state and the low-resistance state, with write pulses applied thereto.

The time required for writing, in particular for crystallization, depends on the time of crystallization of the material used. Hence, data writing needs some time duration. The write time needed is said to be tens to hundreds of ns (nanoseconds) with a material preferentially used as a commonly used phase change material, such as Ge2 Sb2Te5.

As regards the phase change memory (PRAM), reference is made to, for example, the disclosure of Patent Document 1.

[Patent Document 1]
JP Patent Kokai Publication No. JP-P2005-100617A

SUMMARY OF THE DISCLOSURE

The entire disclosure of Patent Document 1 is incorporated herein by reference thereto. The analysis described below is given by the present invention.

If the phase change device is to be used as a cell of a semiconductor memory to implement high speed random write access, as in a DRAM (Dynamic RAM), the circuit size would be increased due to a complex control circuit or a latch circuit used for data retention, because the cell write operation is not finished within one clock cycle.

To provide for time equal to write time to avoid the circuit size from increasing, it may be contemplated to increase the number of pre-fetched data during the write operation. However, with a material with a long write time, the number of the pre-fetched data is excessively increased to obstruct random access operations.

FIG. 1 illustrates a write operation in case a memory of an SDRAM (Synchronous DRAM) interface is configured using a phase change memory. It is presupposed that, in the operation example, shown in FIG. 1, the time needed for writing in the phase change memory cell is 80 ns, only by way of example. In FIG. 1, ACT is an Act (Activate) command, and WRT is a Write command. NOP is a No-operation, PRE is a PRECHARGE command, tCK is a period of a clock signal CLK, tRCD is a delay time from an ACT command to a write/read command, tWR is a write recovery time, and tRP is a time from a PRE command to an ACT command.

The write time in a phase change memory cell is longer than one cycle of an SDRAM (in an example shown in FIG. 1, the clock period tCK is equal to 10 ns). Hence, the write operation in a memory cell cannot be finished in one clock cycle. That is, the time of 8 clock cycles, that is, the time equal to 8 times one clock period, is needed to complete the write cycle. Thus, by writing eight bits consecutive data (8-bit based write, where 8-bit is fixed), the write operation can be performed without occurrence of write conflict.

In this case, the write operation has to be done necessarily in terms of 8-bit consecutive data (D0 to D7) as a unit (page write of 8 bits).

Thus, if an interrupt, such as an interrupt for performing the other write operation, occurs in the course of one write operation of the eight consecutive bits, a write conflict is produced to render it impossible to continue the write operation. FIG. 2 shows an operation example for this case. Specifically, FIG. 2 shows a case wherein, while it is necessary to carry out the write operation in terms of 8 bits as a unit, an interrupt operation for data write takes place every four bits (every four cycles).

The write time of 80 ns is needed for data write in a memory cell, as previously stated, so that the write conflict is produced. In the example of FIG. 2, the write conflict is produced in the course of several 8-bit-based write operations (page write operations of 8 bits) differing in timing from one another by four cycles each.

In the circuit configuration where the write circuitry or I/O lines (transfer lines for write data and read data) are used in common as in a conventional DRAM, data conflict is produced, thus disabling the data write.

The phase change material, used for a phase-change memory, is a material represented by Ge2Sb2Te5, for instance. With this phase change material, the write time of the order of tens to hundreds of ns is required. Such write time depends on the time needed for crystallization.

If this material is used for a RAM, such as a DRAM, the data write in the phase change memory cannot be completed every write cycle. It is because the write cycle of the DRAM, for example, is shorter than the write time for the phase change memory. Hence, there is no alternative but to extend the write cycle.

It is supposed that, in order to cope with this problem, a plural number of data, as a unit, are written in a lump, a number of cycles of data equivalent to the write time of the phase change memory is pre-fetched and the plural number of data are written simultaneously in a plural number of cells of the phase change memory. In such case, the number of data pre-fetched needs to be increased, as described above, because the write time in the phase change memory is longer than the write time in the RAM. If the number of the data pre-fetched is increased, the memory cells are simultaneously accessed in terms of the plural number of the pre-fetched data as a unit, with the result that the merit of the RAM capable of random access to respective memory cells is lost.

Accordingly, it is an object of the present invention to provide a method and an apparatus for write control in which random write can be performed with relatively long write time of a phase change memory being hidden.

The invention disclosed in the present application has substantially the following configuration.

According to the present invention, a preset number of data, adapted to write time in, for example, a phase change memory cell, are pre-fetched, and a plural number of cycles of the data are written simultaneously in a lump.

According to the present invention, a plural number of cycles of write data are written in a lump in respective memory cells, at a cycle of a preset cycle number. The combination of a bit in a page, in which the write data are written, is arbitrary, whereby it is possible to provide for apparently random write.

According to the present invention, the write data of a previous write request is compared with the write data of a current write request. In case of coincidence of the current write data with the previous write data, the current write data is not written, and in case of non-coincidence, the current write data is written.

A semiconductor memory device according to the present invention includes: a memory array including a plurality of cells; a read data latch that holds read data from the cell, said read data latch holding write data entered; a write data latch that holds write data for the cell; a transfer switch that controls the transfer of the data held by said read data latch to said write data latch; wherein said write data latch storing the data which has been transferred from said read data latch to said write data latch via said transfer switch; a comparator circuit that decides whether or not the data held by said read data latch is coincident with the data held by said write data latch; and a latch circuit that holds an output of said comparator circuit. When there is a write request pending, in case the result of comparison by said comparator circuit indicates non-coincidence, the data in said write data latch is written in the cell, and in case the result of comparison by said comparator circuit indicates coincidence, the data in said write data latch is not written in the cell; whereby data is written only for bits in need of data writing.

According to the present invention, read data of each of memory cells of a page size is stored in the read data latch after issuance of an ACT (Activation) command. The read data sampled by the read data latch is transferred to the write data latch before the read/write operation is carried out, so that the same data are stored in the read data latch and in the write data latch.

According to the present invention, after the latch is settled, data of the read data latch is transferred to the write data latch, so that data held in the read data latch is the same as the data held by the write data latch.

According to the present invention, data being written is stored in the write data latch, and the read data latch holds write data from outside. When there is an incoming write request to the memory cell being written, data write operation in the memory cell is completed without interruption. The write data of the incoming write request is written in the memory cell at a timing of the next write cycle after the completion of the pending write operation in the memory cell.

According to the present invention, there is provided a write flag latch that latches an output of the comparator circuit responsive to a latch timing signal activated after a preset number of cycles from activation of the ACT (Activation) command.

According to the present invention; set write or reset write in the cell is carried out in accordance with data stored in the write data latch responsive to a write pulse (WSET or WRST).

According to the present invention, the semiconductor memory device may further include a circuit for generating a one-shot pulse when a bank is activated, and a shift register having a preset number of stages. The one-shot pulse is transferred via a changeover switch to a first stage of the shift register as data of a preset logic value. The shift register shifts the data of the preset logic value each time a write request is applied to the bank. The semiconductor memory device may further include a write pulse control circuit for generating a write pulse at a time point the data of the preset logic value has been shifted to the last stage of the shift register. The write pulse control circuit may exercise control so that the data of the preset logic value, shifted to the last stage of the shift register, is fed back to the first stage of the shift register via the changeover switch, the data of the preset logic value is shifted each time a write request is applied to the bank, and so that a write pulse is again generated after a preset number of cycles.

A method for controlling a write operation in a semiconductor memory device according to the present invention includes:

storing write data in a read data latch, and subsequently transferring the write data to a write data latch, adapted to hold data being written in a cell; and receiving a write request and subsequently writing a plurality of cycles of the write data in a lump in a plurality of cells, at a cycle of the cycle number equal to the preset number.

The combination of a bit in a page, in which the write data are written, is arbitrary, making it possible to provide for apparently random write access.

According to the present invention, the previous write data is compared with the current write data, and data is not written in case of the two data being coincident and not written in case of the two data being not coincident each other.

The meritorious effects of the present invention are summarized as follows.

According to the present invention, the relatively long write time of a phase change memory may be hidden and random write may be implemented.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES OF THE INVENTION

Figure 1:
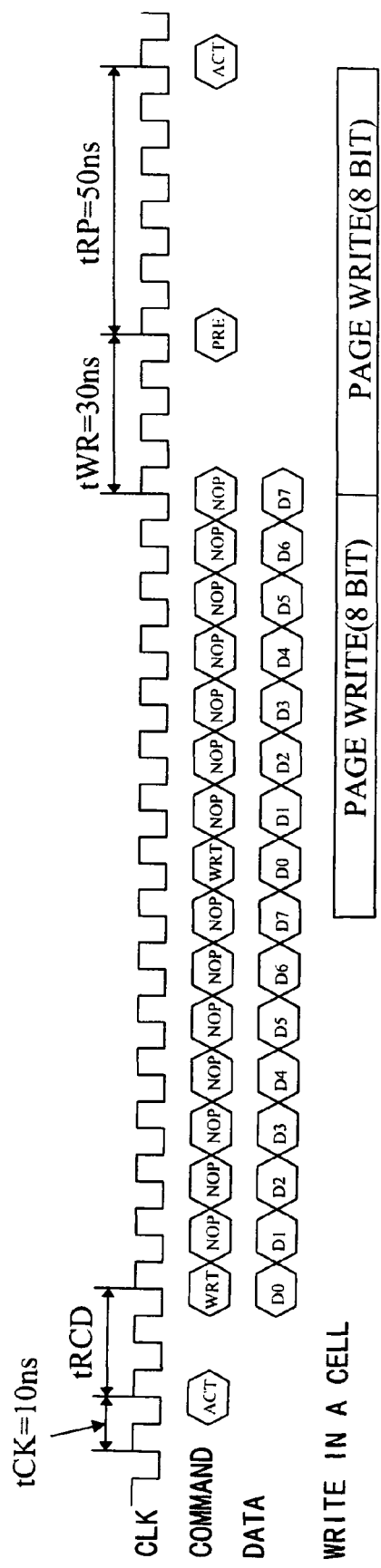
FIG. 1 is a timing diagram for illustrating 8-bit based write (8-bit fixed write system) for a phase change memory.
Figure 2:
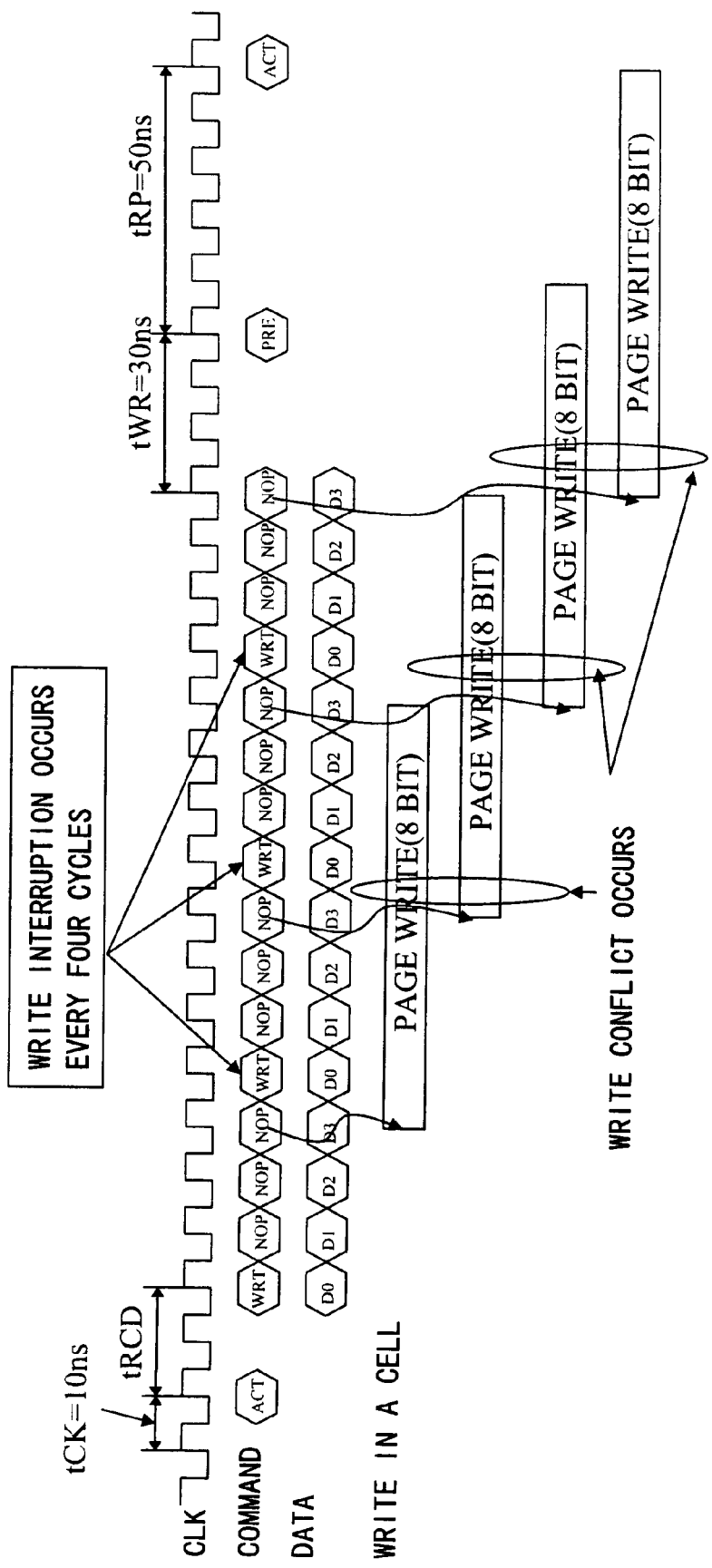
FIG. 2 is a timing diagram for illustrating 8-bit based write (8-bit fixed write system) for a phase change memory, in which an interruption has occurred.
Figure 3:
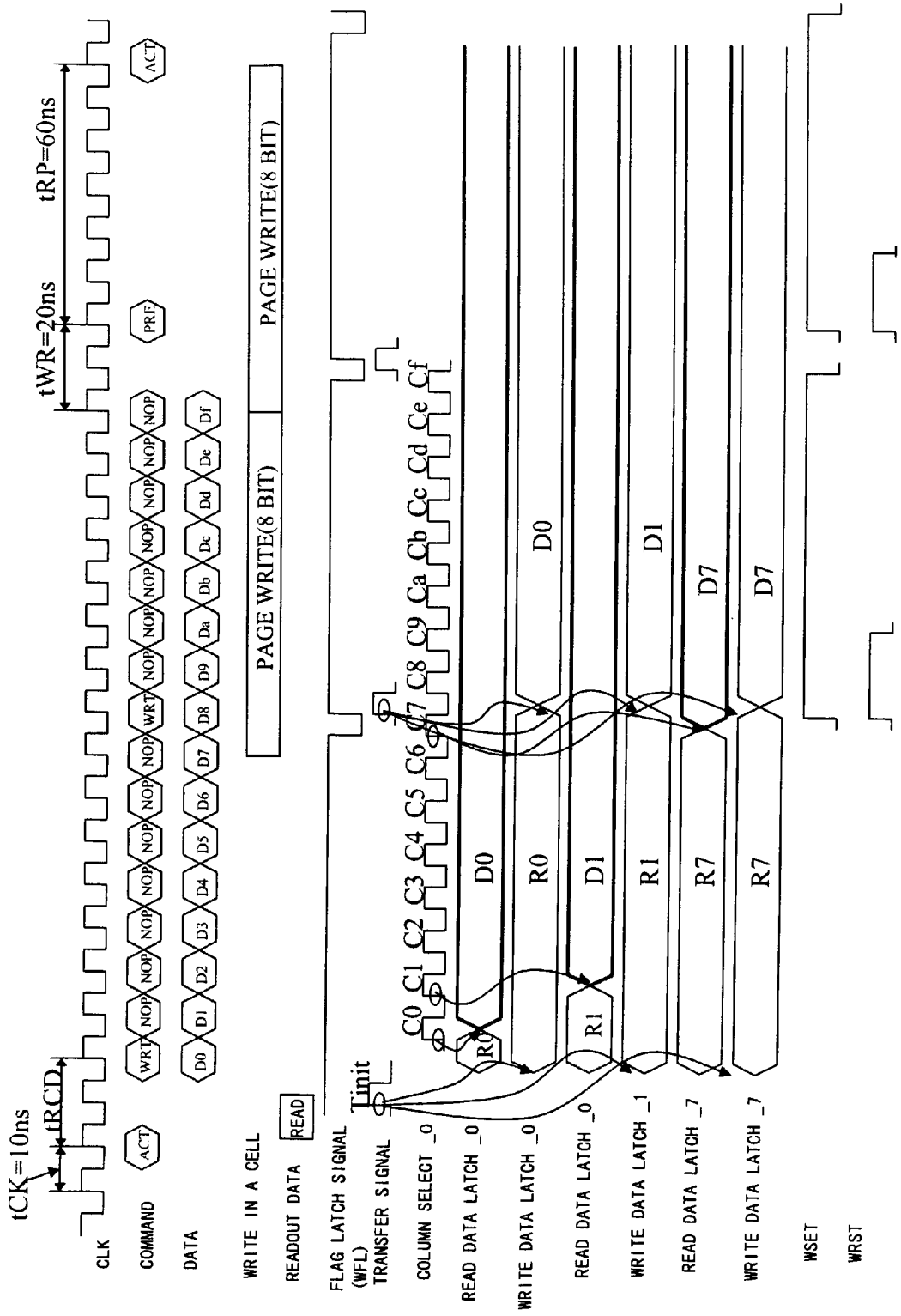
FIG. 3 is a timing diagram showing an illustrative operation of the embodiment of the present invention.

Reference is now made to the accompanying drawings for further detailed description of the present invention. FIG. 3 illustrates a timing diagram showing an example of the write sequence of the present invention wherein a phase change memory is applied to a clock synchronous DRAM (termed as SDRAM). It is assumed here that the time needed for writing in the phase change memory is 80 ns, only by way of an example, i.e., with no limitation imposed on the present invention. Since it is presupposed that the write operation is performed in terms of 8 bits as a unit (in 8-bit pre-fetch), with a clock period tCK=10 ns, it is necessary to provide for the time of 80 ns as the write time.

Figure 4:
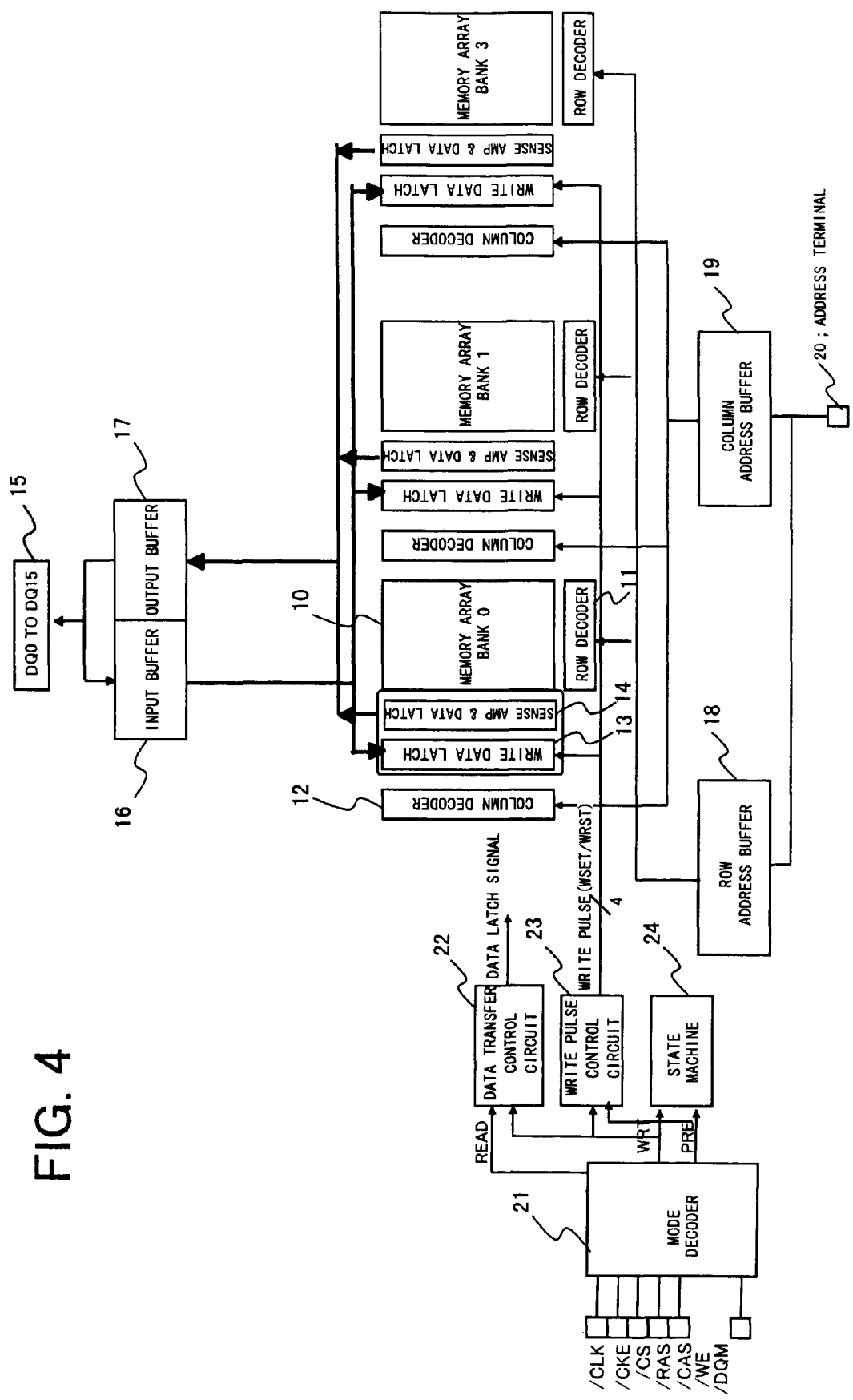
FIG. 4 is a block circuit diagram showing the configuration of an example of the present invention.
Figure 5:
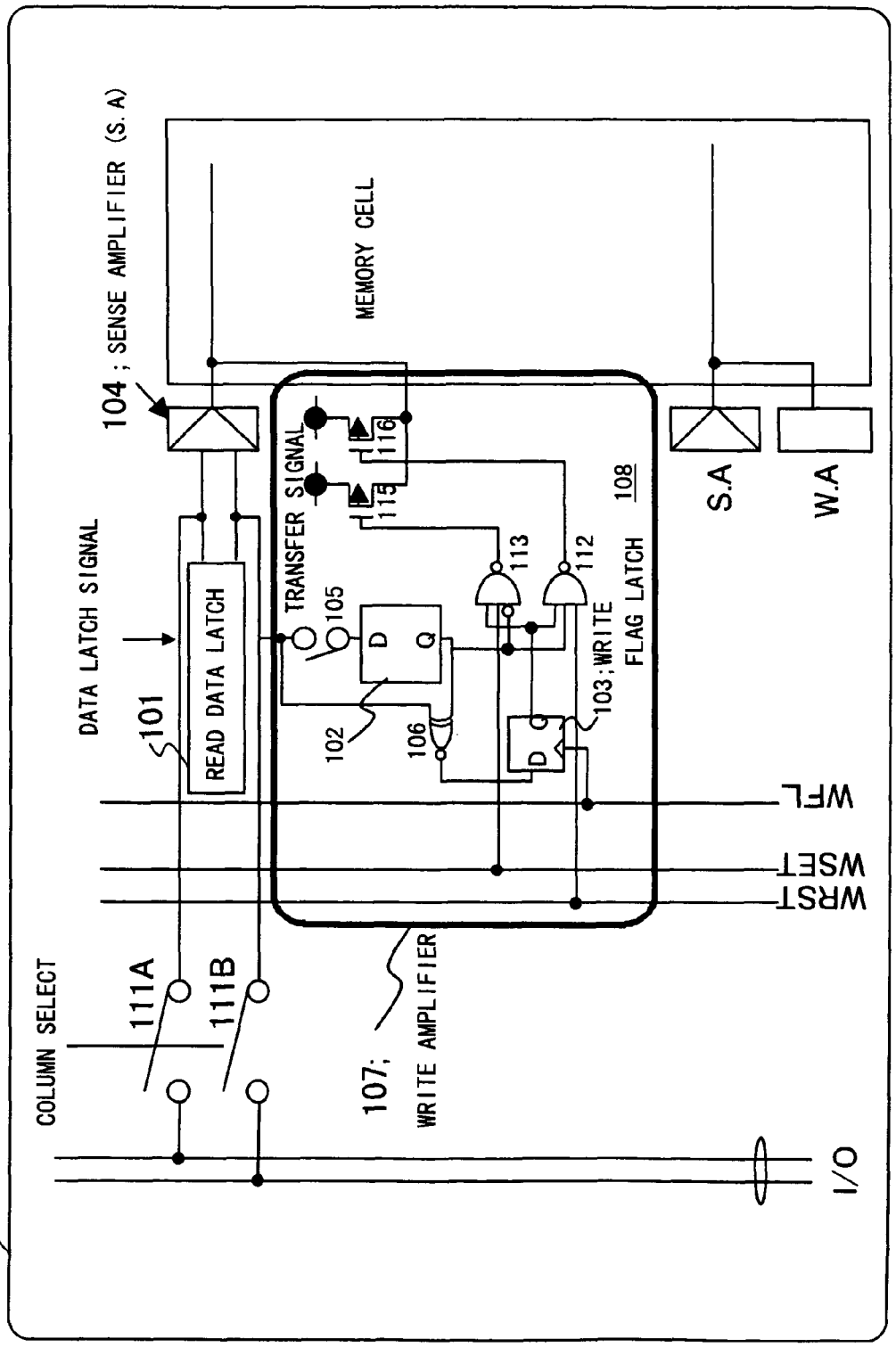
FIG. 5 is a schematic circuit diagram for illustrating the configuration of a data latch circuit according to the example of the present invention.
Figure 6:
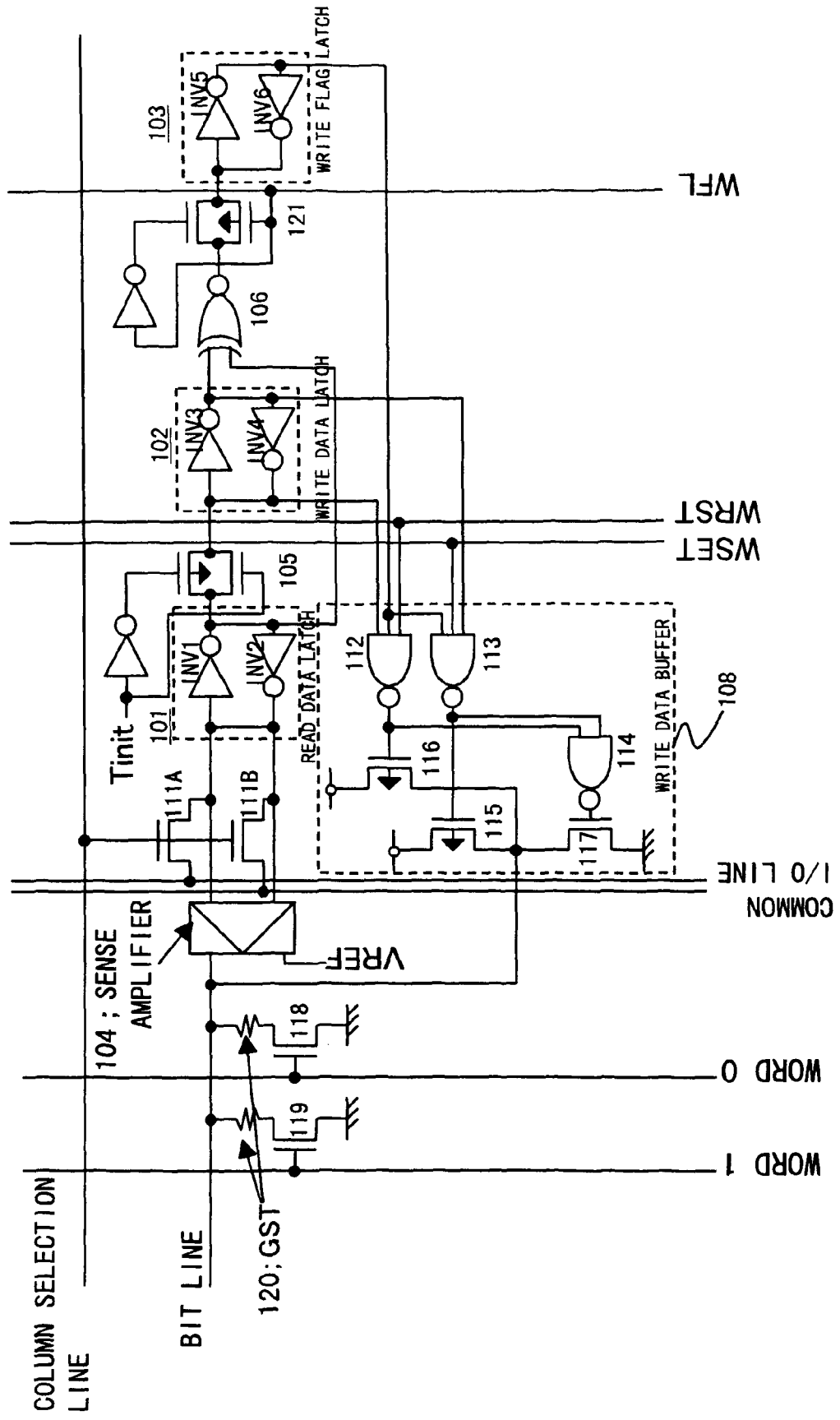
FIG. 6 is a schematic circuit diagram for illustrating the detailed configuration of a data latch circuit according to the example of the present invention.

FIG. 4 illustrates a block circuit diagram for implementing the random write according to the example of the present invention. FIG. 5 depicts a typical circuit configuration for a write data latch 13 and a sense amplifier/data latch circuit 14 of FIG. 4. FIG. 6 depicts a detailed circuit configuration of FIG. 5.

Referring to FIG. 4, it is presupposed that a 4-bank configuration is adopted, as with the typical conventional SDRAM. The circuit shown includes, for each bank, a memory array 10, a row decoder 11 for decoding a row address to select a word line, a column decoder 12 for decoding a column address to set a selected column switch to an on state, a write data latch 13, and a sense amplifier/data latch circuit 14. The circuit also includes, common to the banks, 16-bit data terminals 15 (DQ0 to DQ15), an input buffer 16, an output buffer 17, a row address buffer 18, a column address buffer 19, a mode decoder 21, a data transfer control circuit 22, a write pulse control circuit 23 and a state machine 24. The row address buffer 18 and the column address buffer 19 are connected to an address terminal 20. The mode decoder 21 receives a clock signal/CLK, a clock enable signal/CKE, a chip select signal/CS, a row address strobe signal/RAS, a column address strobe signal/CAS, a write enable signal/WE and a data mask signal DQM. The state machine 24 controls the states for each access cycle.

In the present example, the write start timing which is determined by a write pulse, for example, is set at the outset, as a pre-fetch unit is determined in the semiconductor memory device in accordance with a write speed of the phase change memory. It is assumed here that the pre-fetch unit has been set to 8 cycles. The write start timing is generated in an internal circuit every eight clock cycles with the first write command which is received after an ACT signal that activates the BANK has been received, as a starting point, to effect data write.

According to this system, it becomes unnecessary for the input from outside to be consecutive data of eight or four bits in order to implement random write.

To implement this write operation, three latch circuits are provided in association with each bit line. A data latch circuit 100 is shown in FIG. 5, in which there are shown detailed configurations of the blocks of the write data latch and the sense amplifier/data latch.

Referring to FIG. 5, the data latch circuit 100 of the present example, includes:

a read data latch 101 for holding read data from a memory cell and for latching input write data entered from the data terminals 15 and the input buffer 16 (see FIG. 4) via complementary I/O lines and column switches 111A and 111B, a write data latch 102 for holding data written in the memory cell during the eight cycles until write start, a comparator circuit 106 for comparing outputs of the read data latch 101 and the write data latch 102 to each other, a write flag latch 103 for latching an output of the comparator circuit 106 with a latch timing signal WFL to select a write buffer circuit with which to effect the write operation. The data latch circuit also includes:

a 3-input NAND circuit 112 receiving an output of the write flag latch 103, a write pulse WRST and an output of the write data latch 102, a 3-input NAND circuit 113 receiving the output of the write flag latch 103, a write pulse WSET and an inverted version of an output of the write data latch 102, P-channel MOS transistors (PMOS transistors) 115 and 116, having sources connected in common to a power supply, having gates connected to outputs of the NAND circuits 112 and 113, respectively, and having drains connected in common to a bit line. The comparator circuit 106 is composed of an exclusive-NOR (EXNOR) circuit which outputs HIGH and LOW in case signals compared with each other are coincident or non-coincident, respectively. The I/O lines are provided common to a plural number of columns and are also termed common I/O lines. The I/O lines are connected to the bit lines via the column switches 111A and 111B as selected by column selection lines.

The read data latch 101 holds read data read from the memory cell and amplified by a sense amplifier 104 in association with a read command entered after an ACT command. Specifically, the sense amplifier decides on whether or not the memory cell is in a high-resistance amorphous state or in a low-resistance crystallized state, and holds amplified data.

The write data, received from the data terminal via the input buffer, I/O lines and the switches 111A and 111B, are also held in the read data latch 101. This data transfer is carried out and completed via the I/O lines every write cycle. That is, the read data latch 101 at all times holds data to be retained by a bit which is in an activated state on a bit line.

If there is an incoming read request to an address in question, the data held by the read data latch 101 is read from the common I/O data lines and output via the output buffer (17 of FIG. 4) to a data terminal (15 of FIG. 4). It is noted that the incoming read request may be detected on decoding by the mode decoder 21 of FIG. 4.

The write data latch 102 holds data being written in a memory cell.

When initially a given bank is activated responsive to an input ACT command, the write data latch 102 holds a memory cell data which has been amplified by the sense amplifier 104, held by the read data latch 101 and then transferred to write data latch 102.

Referring to FIG. 6, complementary signal terminals of the sense amplifier 104 are connected to the read data latch 101, which includes a flip-flop composed of inverters INV1 and INV2, having inputs and outputs connected together. The column switches 111A and 111B, on/off controlled by a column selection signal, are connected between an input of the inverter INV1 and an output of the inverter INV2 on one hand and the column switches 111A and 111B on the other hand. An output of the first inverter INV1 of the read data latch 101 is supplied via a transfer switch 105 to the write data latch 102, which includes a flip-flop composed of inverters INV3 and INV4 having inputs and outputs connected together. The transfer switch 105 is a CMOS transfer gate on/off controlled by a control signal Tinit.

An output of the comparator circuit (EXNOR) 106, comparing the outputs of the inverter INV1 of the read data latch 101 and the inverter INV3 of the write data latch 102, is received by a write flag latch 103. This write flag latch 103 includes a CMOS transfer gate 121, which is turned on state when the latch timing signal WFL is HIGH, and inverters INV5 and INV6, having inputs and outputs connected together.

A write data buffer 108 includes:

PMOS transistors 115 and 116 having sources connected in common to the power supply and having drains connected together to a bit line, a NAND circuit 112, receiving an output of the inverter INV4 of the write data latch 102, an output of the inverter INV5 of the write flag latch 103 and the write pulse (reset pulse) WRST, and having an output connected to a gate of the PMOS transistor 116, a NAND circuit 113, receiving an output of the inverter INV3 of the data latch 102, an output of the inverter INV5 of the write flag latch 103 and the write pulse (set pulse) WSET, and having an output to a gate of the PMOS transistor 115, an NMOS transistor 117, connected between the coupled drains (bit line) of the PMOS transistors 115 and 116 and the ground GND, and a NAND circuit 114 receiving outputs of the NAND circuits 112 and 113 and having an output connected to the gate of the NMOS transistor 117.

One or two PMOS transistors 116 and 115 which correspond to the NAND circuits 112 and 113 with a LOW level output are turned on to supply the current to a GST 120 of a cell coupled to the selected word line from the bit line as the power supply.

The operation of initializing the write data latch 102 in the present example is now described.

Directly before generation of the write pulse (WSET and WRST), after lapse of eight cycles from the inputting of the first write command (WRT) after the input bank activation (ACT) command is activated, in write start, data being written is transferred from the read data latch 101 to the write data latch 102 and held therein. More specifically, the data held in the read data latch 101 is transferred to the write data latch 102 via the transfer switch 105 when the transfer control signal Tinit is HIGH.

As for a bit, for which there is no incoming write request, the same data is retained by the read data latch 101 and the write data latch 102. Hence, data in the write data latch 102 is not changed even if data transfer is performed from the read data latch 101 to the write data latch 102 via the transfer switch 105.

A decision on whether or not data is to be output to, that is, written on, a bit line in question (bit line connecting to the write data buffer 108), is given in accordance with the result of comparison by the comparator circuit 106 of the data on the write data latch 102 and the data on the read data latch 101.

In case the two data are non-coincident with each other, the non-coincidence information is stored in the write flag latch 103.

More specifically, the comparator circuit (EXNOR) 106 compares an output of the read data latch 101 (output of the inverter INV1) and an output of the current write data latch 102 (output of the inverter INV3) to each other. The result of comparison is stored in the write flag latch 103, with WFL as latch timing signal.

This data is stored in the write flag latch 103 at the timing directly before data transfer from the read data latch 101 to the write data latch 102. That is, the latch timing signal WFL for the write flag latch 103 is set HIGH directly before generation of the one-shot pulse of the transfer control signal Tinit.

If at this time, there is a write request pending with the WRT being HIGH and if the data which has been written in the phase change memory cell and is held in the write data latch 102, differs from the data in the read data latch 101, the output of the comparator circuit (EXNOR) 106 is LOW and the output of the write flag latch 103 or the output of the inverter INV5 is HIGH. Thus the write operation is carried out. At this time, one of the outputs of the NAND circuits 112 and 113 is LOW. Hence, the output of the NAND circuit 114, receiving the outputs of the NAND circuits 112 and 113, becomes HIGH and the NMOS transistor 117 is turned on.

In case the output of the inverter INV3 of the write data latch 102 is HIGH, that is, the write data is HIGH, and the output of the write flag latch 103 (output of INV5) is HIGH, with the outputs of the two latches 101 and 102 being then non-coincident with each other, the output of the NAND circuit 113 becomes LOW when the write pulse (set pulse) WSET is HIGH. Thus, the PMOS transistor 115 is turned on depending on the write pulse WSET.

In case the output of the inverter INV4 of the write data latch 102 is HIGH, that is, the write data is LOW, and the output of the write flag latch 103 (output of INV5) is HIGH, with the outputs of the two latches 101 and 102 being then non-coincident with each other, the output of the NAND circuit 112 becomes LOW when the write pulse (reset pulse) WRST is HIGH. Thus, the PMOS transistor 116 is turned on depending on the write pulse WSRT.

In case the incoming write request is for the same data as that already written in the phase change memory cell, the write data from the common I/O lines, that is, the output of the inverter INV1 of the read data latch 101 and the output of the inverter INV3 of the write data latch 102, are coincident with each other. Thus, the output of the comparator circuit (EXNOR) 106 becomes HIGH, the output of the write flag latch 103 becomes LOW and the outputs of the NAND circuits 112 and 113 both become HIGH, so that the PMOS transistors 115 and 116 are both turned off and hence the data is not written in the memory cell.

In this manner, the decision is given in each write data latch 13, and the write operation is only for needed data.

Then, the memory cell is written to the set or reset state, in accordance with data stored in the write data latch 102, in synchronization with the input timing of the write pulses (WSET, WRST).

The write operation for the phase change memory cell, if started once, cannot be interrupted halfway. The reason is that, if the write operation is discontinued halfway, the data written in the memory cell is destroyed. FIG. 6 shows an example of a circuit for implementing the aforementioned sequence of write operations.

The phase change memory cell is constituted by a series connection of a single GST (phase change device of Ga—Sb—Te) and an NMOS transistor. In FIG. 6, two memory cells, namely a memory cell constituted by a GST 120 and an NMOS transistor 119 and another memory cell constituted by a GST 120 and an NMOS transistor 118, are connected between the bit line and the ground GND. Gates of the NMOS transistors 118 and 119 are connected to word lines Word0 and Word1, respectively. The NMOS transistor with a gate connected to the selected word line is turned on.

The sense amplifier 104 decides whether or not the memory cell is in a high resistance state (RESET) or in the low resistance state (SET). The sense amplifier 104 decides data by comparing a voltage of a bit line and a reference voltage VREF, supplied from outside, and stores the decided data in the read data latch 101.

Data transfer with the external I/O is via the column switches 111A, 111B connected between the common I/O lines and the read data latch 101. The column switches 111A and 111B each are composed of a MOS transistor, to the gate of which is connected the column selection line. The column selection line, associated with a column as selected by the column decoder (12 of FIG. 4), is activated to turn on the column switches 111A and 111B, as in the case of commonly used DRAMs.

The transfer switch 105, which is composed of a CMOS transfer gate, turned on when the transfer signal Tinit is HIGH, is provided between the read data latch 101 and the write data latch 102. The data on the read data latch 101 is transferred to the write data latch 102, via this switch 105, at the time of the write data initializing operation, following the bank activation, and when the write request is issued at an interval of eight cycles.

The data on the read data latch 101 and that on the write data latch 102 are compared with each other in the comparator circuit (EXNOR) 106 to check if these data are non-coincident or not in order to decide on whether or not the data write operation is to be carried out. The write flag latch 103 latches an output of the comparator circuit (EXNOR circuit 106) with the signal WFL.

When the output of the write flag latch 103 has become HIGH, the write data buffer 108 is activated to carry out the data write operation. In this manner, the data write for the memory cell is carried out.

The operation of the present example is now described in accordance with an example of the write sequence shown in FIG. 3. In the following, the case where the write cycle into the phase change memory is supposed to be 80 ns is explained by referring to the timing diagram of FIG. 3 and FIGS. 4 to 6. It is also assumed that the present example is applied to an SDRAM which receives an externally supplied clock signal CLK with the frequency of 100 MHz (tCK=10 ns).

The write cycle is 80 ns, so that, if 8 bits are written each time in a lump, 8×10=80 ns and hence the data write operation may be achieved without write conflict.

The write pulses WSET and WRST are generated within a chip every eight cycles, from the initial write request, to carry out data write in the cell.

To assure a timing margin for data transfer time between the read data latch 101 and the write data latch 102, the SET write time of the present example, as prescribed by the pulse width of the pulse WSET, is assumed to be 70 ns shorter than 80 ns by one cycle.

After the ACT command is issued, a word line is activated, as in the case of the commonly used DRAMs. Memory cell data of a page size is amplified by the sense amplifier 104 and read data is stored in the read data latch 101. Although the read data latch 101 of the present example includes inverters having an input and an output coupled to each other, it is possible to use a cross-coupled latch amplifier as exemplified by a typical sense amplifier for a DRAM.

The data sampled by the read data latch 101 is transferred to the write data latch 102, before the initial column selection line (C0) is activated, that is, before the read/write operation is carried out. At this time, the transfer switch 105 is set in an on state. The amplifying operation in the sense amplifier 104 is completed when the same data has been stored in the read data latch 101 and in the write data latch 102.

The write data is then transferred, responsive to the column address and the write command (WRT), to the read data latch 101, matched to the input address, via the I/O lines and the column switches 111A and 111B.

At this time point, the data on the read data latch 101 is not transferred to the write data latch 102. The write data latch 102 holds initially transferred data for an eight-cycle time interval.

At the falling edge of the column selection line in the eighth cycle, the signal WFL is set to HIGH to settle the write flag which is the result of comparison of the data in the read data latch 101 and the data in the write data latch 102.

An output of the write flag latch 103 is set to HIGH to write data only in case data in the read data latch 101 differs from data in the write data latch 102.

After the data in the write flag latch 103 is settled in this manner, the data in the read data latch 101 is transferred to the write data latch 102 to render the data in the two latches 101 and 102 coincident with each other. With this data transfer, the data to be written in the memory cell is transferred to the write data latch 102.

When data transfer from the read data latch 101 to the write data latch 102 has come to a close, the write pulses WRST and WSET are generated simultaneously. The two write pulses WRST and WSET are used because the write pulse width and the current value supplied to the cell differ in dependence upon whether the phase change cell is to be set to an amorphous state or to a crystallized state. In general, the high current has to be supplied for short time (20 ns here) to set the amorphous state (reset state), whereas the low current has to be supplied for long time (70 ns here) to set the crystallized state (set state). In this case, the pulse widths of the write pulses WRST and WSET are set to 20 ns and 70 ns, respectively.

The write pulses WRST and WSET are generated in common with the previous page. However, as to whether or not data write is executed, only the write data buffer 108 where an output of the write flag latch 103 (an output of the inverter INV5) is HIGH at a time point when the write pulse is applied, thus latching the state of non-coincidence of the result of comparison of the comparator circuit 106, operates to write data.

During the data write operation, that is, as long as the write pulse is asserted, the write information is retained by the write data latch 102. Thus, if there is an incoming read/write request from outside, such request is dealt with only within the read data latch 101, such that, during the eight-cycle time interval, data keeps on to be retained by the write data latch 102. During this eight-cycle time interval, data in the write data latch 102 are controlled to be non-updated.

When the write pulses WRST, WSET become LOW, the next write information is transferred from the read data latch 101 to the write data latch 102.

After the end of data write, the data in the read data latch 101 is transferred to the write data latch 102. If no write data has been entered during this time, the data in the read data latch 101 and that in the write data latch 102 are coincident with each other, so that the data write comes to a close.

The data written in the read data latch 101 during the previous data write time is then written in the write data latch.

Figure 7:
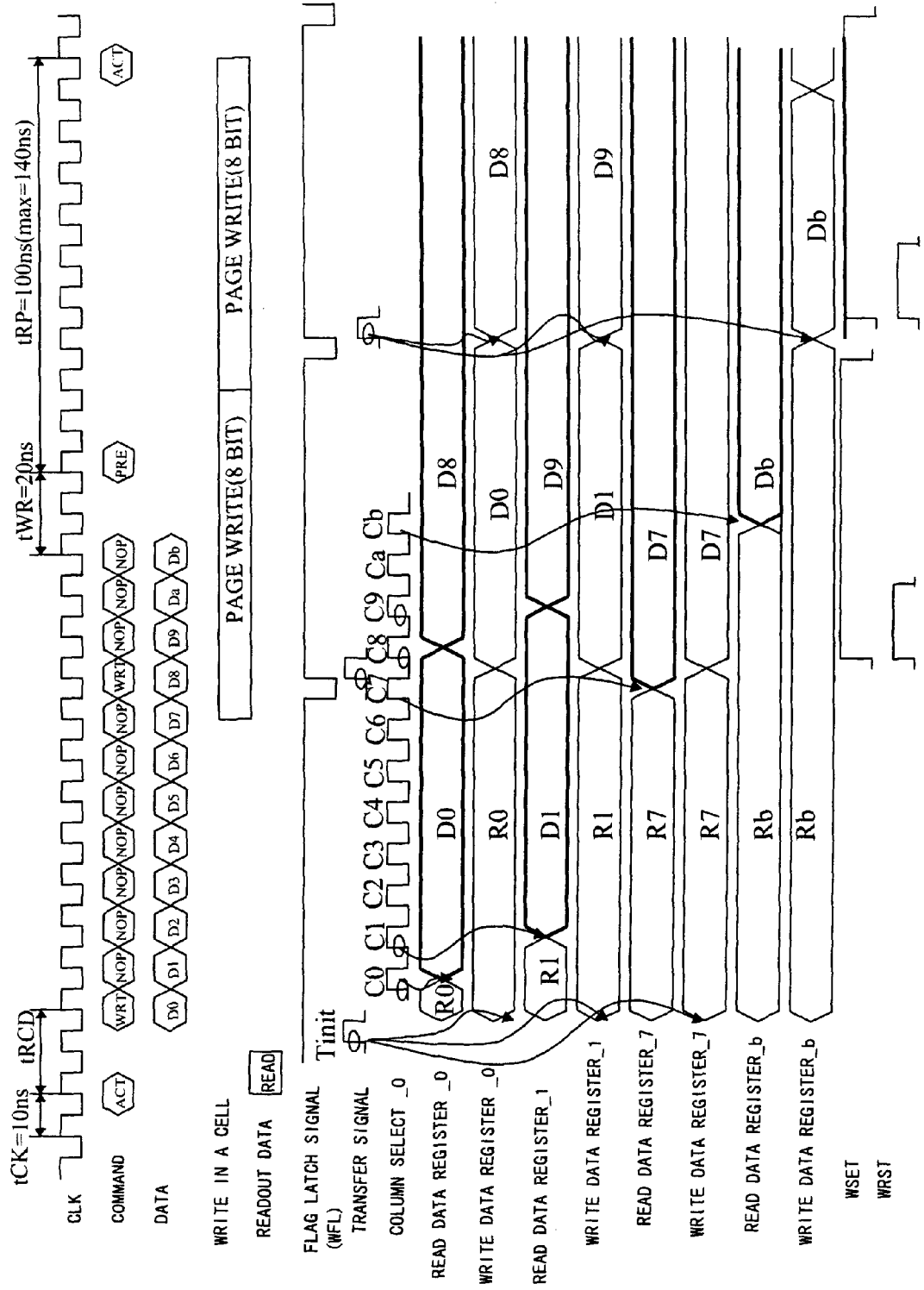
FIG. 7 is a timing diagram for illustrating another illustrative operation of the example of the present invention.

In the operation example, shown in FIG. 3, data is supplied every eight cycles. However, since random write is allowed, there may be such a case in which a precharge command (PRE) is supplied after a succession of 12 cycles of data write (data write of data D0 to Db), as shown in FIG. 7. In the present example, even if the data write has not come to a close at a time point when the precharge (PRE) command is entered, data write continues to be carried out. The remaining data is written after the end of the eight cycles and the word line is then deactivated.

Thus, tRP (time from tRE to ACT) equal to 10 ns×4 cycles×2−$tWR$(20 ns)=140 ns at the maximum, in comparison to 30 ns for the normal case, is needed since the last data (Db) is input until ACT is input next time. FIG. 7 shows an operation example in which a PRE command is input during data write such that tRP is equal to 100 ns (140 ns at the maximum).

For example, if the write cycle is 40 ns, tRP is such that $tRP$=100 ns×4 cycles×2−$tWR$(20 ns)=60 ns which is approximately twice the value of the normal value of tRP (=30 ns). Hence, the write time may be hidden in the usual tRP value of 30 ns.

If the write cycle of 20 ns is achieved, tRP is such that $tRP$=10 ns×2 cycles×2−$tWR$(20 ns)=20 ns so that the write time may be hidden within the usual tRP value of 30 ns.

Figure 8:
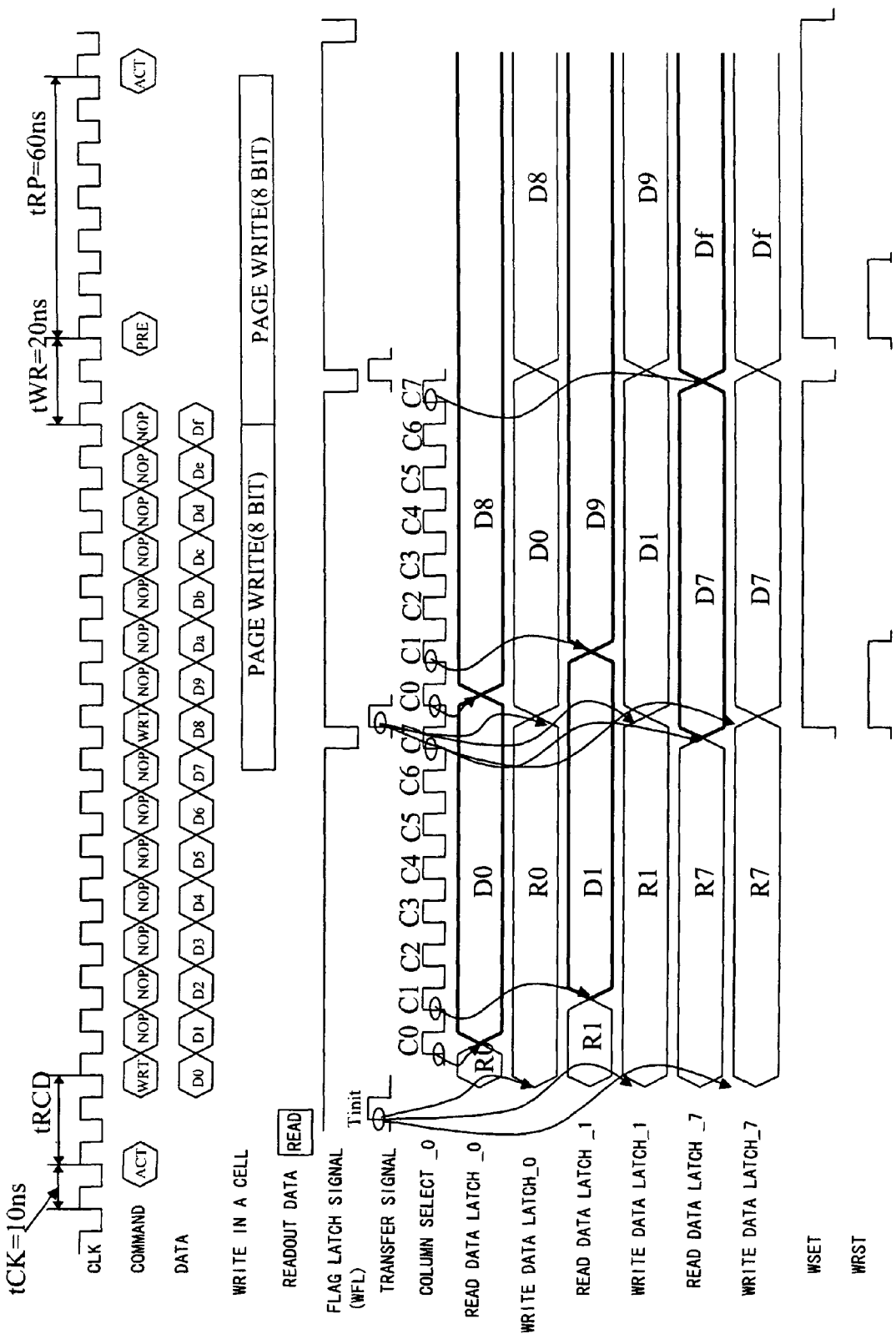
FIG. 8 is a timing diagram for illustrating yet another illustrative operation of the example of the present invention.

FIG. 8 depicts a timing diagram showing an operation example in which the write cycle is 40 ns. Specifically, FIG. 8 shows a case where for a bit being written, another write request is issued, that is, a case where two write requests have been made in connection with the same address. In this case, the data being written is stored in the write data latch 102, while the same write data is retained in the read data latch 101.

In the present example, data write operation is not interrupted, even if there is an incoming write request for the bit being written, and data write operation in the memory cell is continued to come to a close without interruption.

This data (write data to the bit being written) is written in the memory cell at a write timing of the next cycle, generated in a chip, after the completion of the data write in the memory cell.

Figure 9:
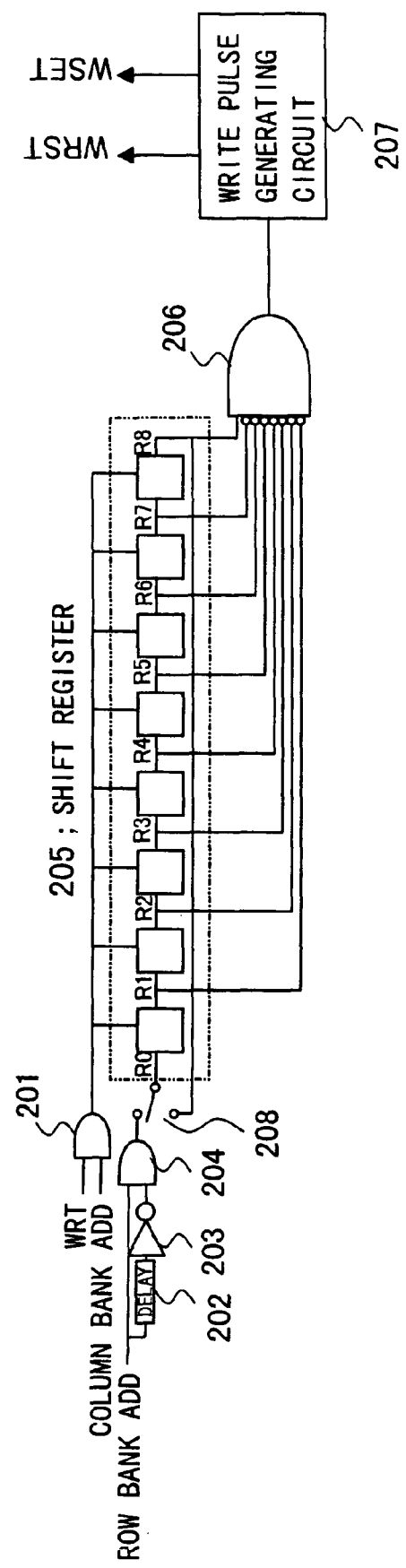
FIG. 9 is a circuit diagram showing the configuration of a write pulse control circuit of the example of the present invention.
Figure 10:
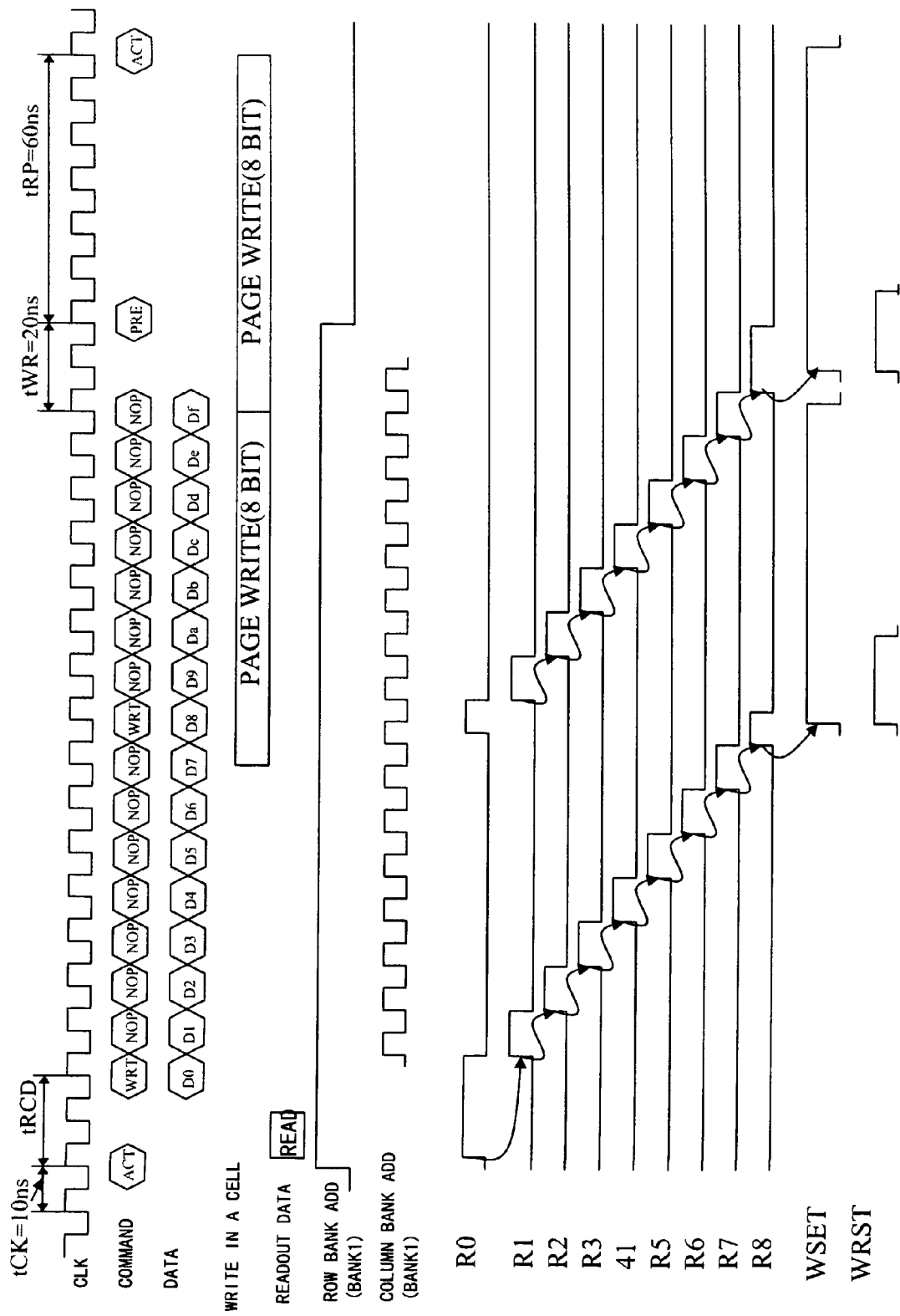
FIG. 10 is a timing diagram showing an illustrative operation of the write pulse control circuit of the example of the present invention.

FIG. 9 shows a typical configuration of the write pulse control circuit 23 of the present example. FIG. 10 schematically shows operational waveforms of the circuit of FIG. 9.

Referring to FIG. 9, the write pulse control circuit 23 includes a shift register 205 and a decision circuit 206. A circuit, which comprises:

a delay circuit 202 receiving a signal (Row Bank add), an inverter 203 receiving an output of the delay circuit 202, and an AND circuit 204 receiving the signal (Row Bank add) and an output of the inverter 203, generates a one-shot pulse of a pulse width of a time duration from the rising edge of the signal (Row Bank add) to the end of the delay time of the delay circuit 202 when the signal (Row Bank add) becomes HIGH. An output of an AND circuit 201 receiving the signal WRT and the signal (Column Bank add), is supplied as a shift clock to each stage of the shift register 205. An output of the AND circuit 204 and an output (R8) of the last stage of the shift register 205 are supplied via a changeover switch 208 to the first stage of the shift register 205.

When the bank is activated, a one-shot pulse is generated from the bank activation signal (output of the AND circuit 204) to transfer a HIGH data to the first stage R0 of the shift register 205.

This HIGH data is then shifted each time a write request (the signal WRT being HIGH) is supplied to the bank.

The eight cycle write requests have arrived at a time point when the HIGH data has been shifted to the last stage R8 of the shift register 205. The output of the decision circuit 206 becomes HIGH. The output of a write pulse generating circuit 207 outputs WRST and WSET to write data in the memory cell.

The data of the stage R8, shifted through the shift register 205, is fed back via a changeover switch 208 to the first stage R0. This data is shifted every write request, that is, each time the HIGH WRT pulse has arrived. After eight cycles, the write pulses WRST and WSET are generated from the write pulse generator 207.

Referring to the timing diagram of FIG. 10, HIGH data is set in the first stage R0, responsive to the bank active signal (Row Band add). This HIGH data is shifted by the write requests, until HIGH data is set only in the last stage R8. The write pulses WSET, WRST are generated with this timing as a start point. This write system allows for a random high-speed write operation as the write time for phase change memory cells is hidden.

With the present example, the write operation for consecutive write bits may be implemented even with a write system other than the 8-bit fixed write system. In the above-described example, wherein the time needed to write data in a memory cell is assumed to be 80 ns, tRP becomes relatively long. However, tRP may be relatively reduced if the time needed to write data in a memory cell is made shorter than 80 ns, such as 40 ns or 20 ns.

With the use of the high-speed write material, described above, it is possible to fabricate a ransom-access memory, exhibiting random accessibility, even with the DRAM.

In the circuit configuration, shown in FIG. 4, the write operation is carried out from bank to bank. However, the present invention is not limited to bank-based write. For example, the write operation may be achieved on the chip basis, each bank may be divided into a plural number of blocks and the write operation may be achieved on the block basis.

Figure 11:
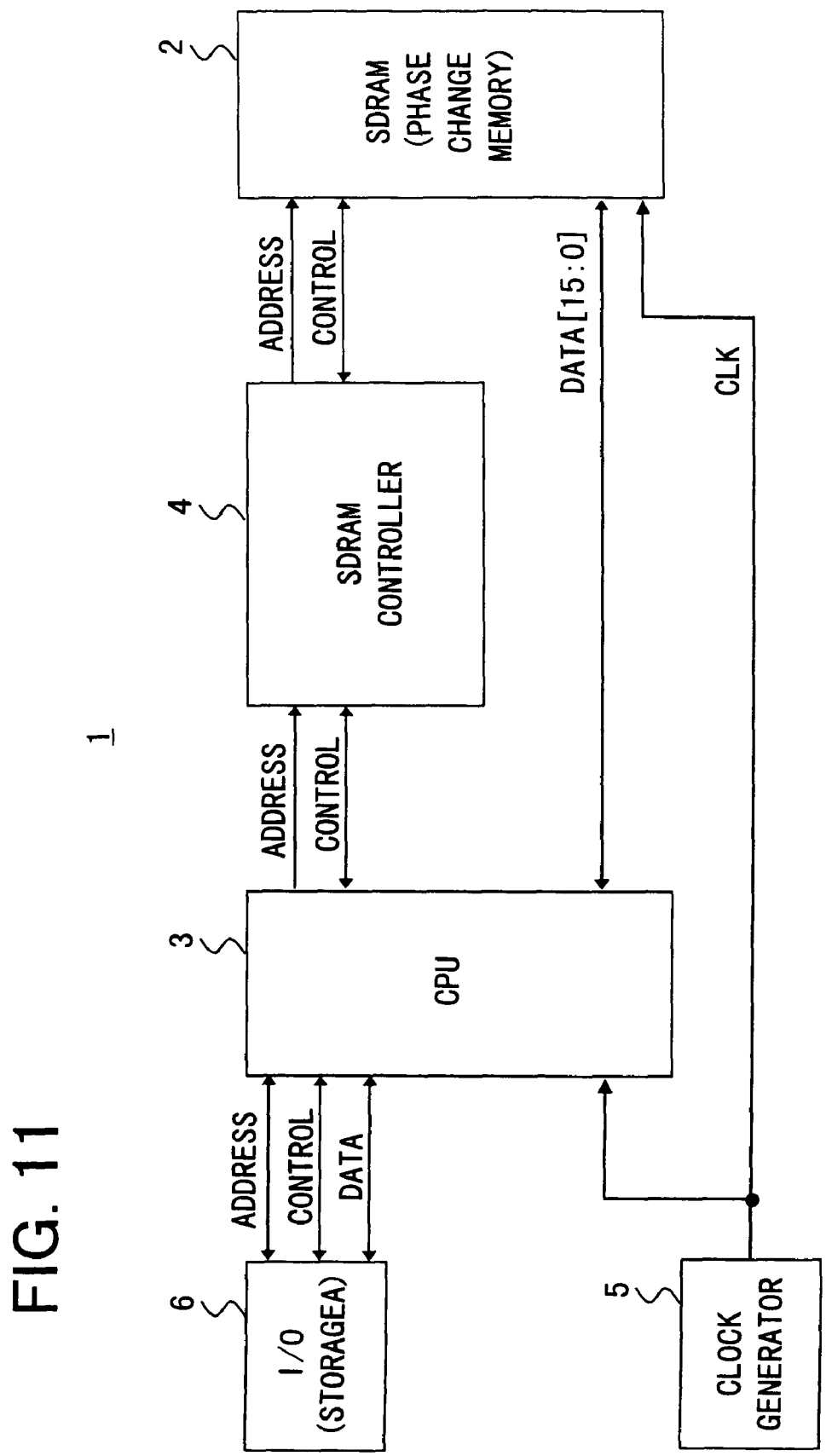
FIG. 11 is a block diagram showing the configuration of an information processing system of the example of the present invention.

FIG. 11 illustrates the configuration of an example of a system in which there is arranged a SDRAM device with phase change memory cells according to the present invention. Referring to FIG. 11, the system 1 according to the present example includes a SDRAM device 2 according to the above described example, a CPU 3 which fetches and decodes an instruction to execute the instruction, a SDRAM controller 4 which includes an interface module (bus interface) for the CPU 3 and an interface module for the SDRAM device 2, and a clock generator 5 which supplies an external clock signal to the CPU 3, the SDRAM controller 4 and the SDRAM device 2.

In FIG. 11, with no limitation being imposed on the present invention, the CPU 3 may be connected to an I/O device (or a storage device) 6, wherein the I/O device may be such a device as a display device, an input device or the like, while the storage device may be such a device as an EEPROM (Electrically Erasable and Programmable ROM) device, a HDD (Hard Disk Drive) device, a CD (Compact Disk)/DVD (Digital Versatile Disk) device or the like. The CPU 3 and the SDRAM controller 4 may have an internal clock generator such as a PLL (Phase Locked Loop) which receives an external clock supplied from the clock generator 5 to generate an internal clock synchronized with the external clock. In the system 1, the SDRAM device 2 may be arranged in a chip or DIMM (Dual Inline Memory Module) form.

When executing a memory access (Read/Write) to the SDRAM device 2, the CPU 3 issues a command to the SDRAM controller 4, the SDRAM controller 4 translates the command from the CPU 3 into a command sequence for the SDRAM device 2 to supply the command sequence to the SDRAM device 2. In case of a write command being issued by the CPU 3, the SDRAM controller 4 generates the command sequence (such as an activate bank command ACT, a write command WRT, a precharge command PRE) as shown in FIG. 3, for example. Meanwhile, the SDRAM controller 4 may perform bank control of the SDRAM device 2 and may also control timing parameters such as tRCD and tRP in the SDRAM device 2. The system 1 in the present example may suitably be applied to an information processing system such as a data processing system and a mobile communication terminal.

In the above example, a phase change memory is taken as an example for explanation. However, the present invention may be applied with advantage to implement random high-speed write operations using a memory device different than a phase change memory and which is in need of a longer write time than that with the DRAM or SRAM, such as RRAM (Resistance RAM), MRAM (Magnetoresistive RAM) or FeRAM (Ferroelectric RAM).

Although the present invention has so far been described with reference to preferred examples, the present invention is not to be restricted to the examples. It is to be appreciated that those skilled in the art can change or modify the examples without departing from the scope and spirit of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a memory array including a plurality of cells;
a control circuit that exercises control for accumulating temporally a preset number of cycles of write data, corresponding to a page size, responsive to a write request, and writing in the respective cells a plurality of cycles of said write data temporally accumulated, in a lump, in the preset number of cycles;
said control circuit exercising control such that the combination of a bit in a page, in which said write data is written, is arbitrary to provide apparently random write.

2. The semiconductor memory device according to claim 1, wherein said control circuit includes a circuit that compares, in writing in the cell said write data in a lump, data previously written in said cell and said write data being accumulated to be written in said cell;
said write data not being written if the result of comparison indicates coincidence and said data being written if the result of comparison indicates non-coincidence.

3. The semiconductor memory device according to claim 1, wherein said control circuit generates a write pulse, every preset number cycles, with a first write command after receiving an activation command as a starting point, in such a manner as to write a plurality of said write data in a lump in said respective cells, simultaneously.

4. The semiconductor memory device according to claim 1, wherein said control circuit comprises:

a read data latch that holds data read from the cell; said read data latch holding write data supplied from outside of the semiconductor memory device;
a write data latch that holds write data for the cell;
a transfer switch for controlling whether or not the data held by said read data latch is transferred to said write data latch;
said data held by said read data latch being transferred via said transfer switch to said write data latch and stored therein; and
a comparator circuit that decides on whether or not the data held by said read data latch is coincident with the data held in said write data latch; wherein
when there is a write request,
in case the result of comparison by said comparator circuit indicates non-coincidence, said write data held in said write data latch is written in the cell, and
in case the result of comparison by said comparator circuit indicates coincidence, said write data held in said write data latch is not written in the cell; whereby data is written only for bits in said page in need of data write.

5. A semiconductor memory device comprising:
a memory array including a plurality of cells;
a read data latch that holds read data from a the cell in the plurality of cells, said read data latch holding write data entered;
a write data latch that holds write data for the cell;
a transfer switch that controls the transfer of the data held by said read data latch to said write data latch, said write data latch storing the data transferred from said read data latch to said write data latch via said transfer switch;
a comparator circuit that decides whether the data held by said read data latch is coincident with the data held by said write data latch; and
a latch circuit that holds an output of said comparator circuit,
wherein when there is a write request:
in case the result of comparison by said comparator circuit indicates non-coincidence, the data in said write data latch is written in the cell, and
in case the result of comparison by said comparator circuit indicates coincidence, the data in said write data latch is not written in the cell; whereby data is written only for bits in need of data writing.

6. The semiconductor memory device according to claim 5, wherein, after receiving an activation (ACT) command, data read from each of cells of a page size is stored in said read data latch; and wherein
the data stored in said read data latch is transferred to said write data latch before read/write operation from/to the cell is carried out, so that the same data are stored in said read data latch and in said write data latch.

7. The semiconductor memory device according to claim 5, wherein data being written is stored in said write data latch; and
said read data latch holds write data entered responsive to a write request; and wherein
if another write request is entered for the cell in the midst of data write in said cell associated with said write request, the data write in said cell associated with said write request is completed without interrupting the ongoing data write in the cell; and
the write data associated with said another write request is written in said cell at a timing of data write of the next cycle after completion of the data write in said cell associated with said one write request.

8. The semiconductor memory device according to claim 5, wherein said latch circuit comprises a write flag latch which latches an output of said comparator circuit responsive to a latch timing signal activated after a preset number of cycles from activation of an activation (ACT) command.

9. The semiconductor memory device according to claim 5, wherein set write or reset write in said cell is carried out in accordance with data stored in said write data latch in accordance with an input timing of a write pulse.

10. The semiconductor memory device according to claim 5, further comprising:
a write data buffer circuit that receives an output of said latch circuit and a write pulse to output write data of said write data latch on a bit line.

11. The semiconductor memory device according to claim 5, further comprising:
a circuit that generates a one-shot pulse on activation of a bank;
a shift register of a preset number of stages;
said one-shot pulse being transferred via a changeover switch to a first stage of said shift register as data of a preset logic value;
said shift register shifting said data of the preset logic value each time a write request is entered to said bank;
a write pulse generating circuit that generates a write pulse at a time point said data of the preset logic value has been shifted to the last stage of said shift register; and
a write pulse control circuit that exercises control so that said data of the preset logic value, shifted to the last stage of said shift register, is fed back to the first stage of said shift register via said changeover switch, said data of the preset logic value is shifted each time said write request is entered to said bank, and so that a write pulse is again generated after a preset number of cycles.

12. The semiconductor memory device according to claim 1, wherein said cell includes a phase change cell.

13. The semiconductor memory device according to claim 5, wherein said cell includes a phase change cell.

14. The semiconductor memory device according to claim 1, wherein said cell includes at least one selected from the group consisting of an RRAM (Resistance RAM), an MRAM (Magnetoresistive RAM) and an FeRAM (Ferroelectric RAM).

15. An information processing system including a semiconductor memory device as set forth in claim 1.

16. An information processing system including a semiconductor memory device as set forth in claim 5.

17. A method of controlling a write operation in a semiconductor memory device with a memory array including a plurality of cells, comprising:
accumulating temporally a preset number of cycles of write data entered, corresponding to a page size, responsive to a write request; and
writing in the respective cells a plurality of cycles of said write data temporally accumulated, in a lump, in the preset number of cycles, with control being exercised such that the combination of a bit in a page, in which said write data is written, is arbitrary to provide apparently random write.

18. The method according to claim 17, comprising:
storing said write data in a read data latch and subsequently transferring said write data to a write data latch adapted to hold data being written in the cell; and
receiving a write request and subsequently writing a plurality of cycles of said write data in a lump in a plurality of the cells, at a cycle of a preset cycle number.

19. The method according to claim 17, wherein write data of a previous write request and write data of current write request are compared and wherein data is written or not written if the two data are not coincident or coincident with each other, respectively.

20. The semiconductor memory device according to claim 5, wherein the read data latch comprises first and second inverters having inputs and outputs connected together, and an output of the first inverter is supplied via the transfer switch to the write data latch.

* * * * *